United States Patent
Opiniano

(10) Patent No.: US 10,083,932 B2
(45) Date of Patent: Sep. 25, 2018

(54) PACKAGE ON PACKAGE ARRANGEMENT AND METHOD

(71) Applicant: NVIDIA Corporation, Santa Clara, CA (US)

(72) Inventor: Ernesto A. Opiniano, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 291 days.

(21) Appl. No.: 14/157,817

(22) Filed: Jan. 17, 2014

(65) Prior Publication Data

US 2015/0206862 A1    Jul. 23, 2015

(51) Int. Cl.
| | |
|---|---|
| *H01L 23/00* | (2006.01) |
| *H01L 21/56* | (2006.01) |
| *H01L 25/00* | (2006.01) |
| *H01L 25/065* | (2006.01) |
| *H01L 25/10* | (2006.01) |
| *H01L 23/31* | (2006.01) |
| *H01L 23/498* | (2006.01) |

(52) U.S. Cl.
CPC ............ *H01L 24/81* (2013.01); *H01L 21/563* (2013.01); *H01L 23/315* (2013.01); *H01L 25/0657* (2013.01); *H01L 25/105* (2013.01); *H01L 25/50* (2013.01); *H01L 23/3128* (2013.01); *H01L 23/49816* (2013.01); *H01L 2224/16145* (2013.01); *H01L 2224/16227* (2013.01); *H01L 2224/32145* (2013.01); *H01L 2224/48471* (2013.01); *H01L 2225/1023* (2013.01); *H01L 2225/1058* (2013.01); *H01L 2225/1076* (2013.01); *H01L 2924/12042* (2013.01); *H01L 2924/1432* (2013.01); *H01L 2924/1434* (2013.01); *H01L 2924/15311* (2013.01); *H01L 2924/15331* (2013.01); *H01L 2924/1815* (2013.01); *H01L 2924/18161* (2013.01); *H01L 2924/3511* (2013.01)

(58) Field of Classification Search
CPC . H01L 2924/15311; H01L 2224/32145; H01L 25/0657; H01L 2224/48471; H01L 23/3128; H01L 2224/16145; H01L 23/49816; H01L 2924/15331
See application file for complete search history.

(56) References Cited

U.S. PATENT DOCUMENTS

| | | | | |
|---|---|---|---|---|
| 5,883,426 | A | * | 3/1999 | Tokuno et al. ............... 257/686 |
| 6,022,757 | A | * | 2/2000 | Andoh .......................... 438/106 |
| 6,025,648 | A | * | 2/2000 | Takahashi et al. ........... 257/778 |

(Continued)

*Primary Examiner* — Ngan Ngo
(74) *Attorney, Agent, or Firm* — Zilka-Kotab, PC

(57) ABSTRACT

A method of forming a package on package, semiconductor package arrangement is described. In one aspect, solder bumps on a lower surface of a first grid array package substrate are fused to corresponding unencapsulated solder bumps on an upper surface of a second grid array package substrate. The fused solder bumps form solder joints that electrically connect the first and second packages. The height of the resulting solder joints is greater than a height of a die that is flip chip mounted to the second substrate such that the first substrate does not contact any portion of the second package and an air gap is formed that separates the second die from the first package. Corresponding PoP packages structures are also described.

5 Claims, 4 Drawing Sheets

(56) References Cited

U.S. PATENT DOCUMENTS

| | | | |
|---|---|---|---|
| 6,072,233 A * | 6/2000 | Corisis et al. | 257/686 |
| 7,868,440 B2 * | 1/2011 | Roberts et al. | 257/686 |
| 8,354,301 B2 * | 1/2013 | Roberts et al. | 438/109 |
| 2005/0184377 A1 * | 8/2005 | Takeuchi et al. | 257/686 |
| 2005/0205982 A1 * | 9/2005 | Kawano | 257/686 |
| 2006/0110849 A1 * | 5/2006 | Lee et al. | 438/106 |
| 2007/0063332 A1 * | 3/2007 | Go et al. | 257/686 |
| 2007/0254404 A1 * | 11/2007 | Gerber et al. | 438/109 |
| 2011/0260313 A1 * | 10/2011 | Yim et al. | 257/676 |

* cited by examiner

PACKAGE ON PACKAGE ARRANGEMENT AND METHOD

BACKGROUND OF THE INVENTION

The present invention relates generally to semiconductor packaging. More particularly, improved package on package fabrication techniques and designs are described.

Some semiconductor packaging designs contemplate stacking two or more packaged devices on top of one another. For example, a packaged memory device may be stacked on top of a packaged processor as shown in FIGS. 1(a) and 1(b). In the illustrated arrangement, the top package 100 has solder bumps 101 on its bottom surface 102 facing the bottom package 110. The solder bumps 101 are formed on I/O pads (not shown). The bottom package has a BGA substrate 111 that supports a die 112. The BGA substrate 111 has contact pads 113 on its top surface 115 that are complementary to the solder bumps on top package 100. During assembly of a stacked package on package (PoP) device 120, the top package 100 is placed on the bottom package 110 and the solder bumps 101 are reflowed to form contacts 124 between the I/O pads on the top package 100 and the contact pads 113 as illustrated in FIG. 1(b). Although this approach works well in many applications, warping of either the top or bottom package can sometimes result in one or more contacts not being properly formed, resulting in an "open" contact type defect 125 as diagrammatically illustrated in FIG. 1(b).

Another package stacking approach is illustrated in FIGS. 2(a) and 2(b). In this approach, the top package 100 is generally similar to the top package illustrated in FIGS. 1(a) and 1(b). The bottom package 210 is somewhat similar to the bottom package illustrated in FIGS. 1(a) and 1(b) except that the contact pads 113 on the top surface 115 of BGA substrate 111 are bumped to form solder bumps 217 and the top side of the BGA substrate is overmolded. That is, a molding/encapsulating material 218 such as epoxy encapsulates the die 112 and solder balls 217 on the top surface of the BGA substrate 111 (the die may or may not be exposed). The molding material 218 helps stiffen the package thereby reducing warping. Laser ablation is then used to remove molding material around bumps 217 on the lower package as diagrammatically illustrated in FIG. 2(b). In this state, the top package 100 is placed over the bottom package 210 and the facing solder bumps 101, 217 are reflowed such they join together to form solder joint contacts 224 between the I/O pads on the top package 100 and contact pads on the bottom package 210 as diagrammatically illustrated in FIG. 2(b). Again, this approach works well in many applications. However, the ablation process tends to leave some molding material dust, which can contaminate some of the solder joints as illustrated by joint 224(a) in FIG. 2(b). Such contamination is another type of defect that can result in an open contact type defect or a poor connection. Another drawback of the molding/ablation approach is that the ablation forms troughs or well around the solder balls. Such recesses can be hard to clean and sometimes retain cleaning solution which can have corrosive effects on the solder ball surface and solder joints. Furthermore, a wall of molding material 218(a) to the outside of the solder joints impairs visual inspection of the solder joints after reflow. Therefore, although current package stacking approaches work well in many applications, there are continuing efforts to develop more reliable, low cost packaging designs.

SUMMARY OF THE INVENTION

A method of forming a package on package, semiconductor package arrangement is described. In one aspect, solder bumps on a lower surface of a first grid array package substrate are fused to corresponding unencapsulated solder bumps on an upper surface of a second grid array package substrate. The fused solder bumps form solder joints that electrically connect the first and second packages. The height of the resulting solder joints is greater than a height of a die that is flip chip mounted to the second substrate such that the first substrate does not contact any portion of the second package and an air gap is formed that separates the second die from the first package.

The first grid array package has a first substrate, a first die mounted on the first substrate and a multiplicity of exposed solder bumps on a lower surface of the first substrate. The second grid array package has a second substrate, a second die flip chip mounted on the top surface of the second substrate, a multiplicity of lower solder bumps on a lower surface of the second substrate, and a multiplicity of upper solder bumps on the top surface of the second substrate. No molding material is provided on the top surface of the second substrate and therefore no molding material surrounds around any of the upper solder bumps on the second substrate. In this condition, the upper solder bumps on the second substrate are fused to corresponding solder bumps on the first grid array package. The resulting solder joints electrically couple the first and second grid array packages thereby forming a stacked package on package arrangement. The fused solder bumps are sized such that a height of the resulting solder joints is greater than a height of the second die and such that the first substrate does not contact any portion of the second package and an air gap is formed that separates the second die from the first package. Thus, after the fusing, no portion of the first grid array package physically contacts any portion of the second grid array package other than the solder joints. Preferably, no plastic molding material is provided on the top surface of the second substrate or the lower surface of the first substrate.

In some preferred arrangements, the first grid array package is a memory package and the second die is a processor.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

Figure 3A:
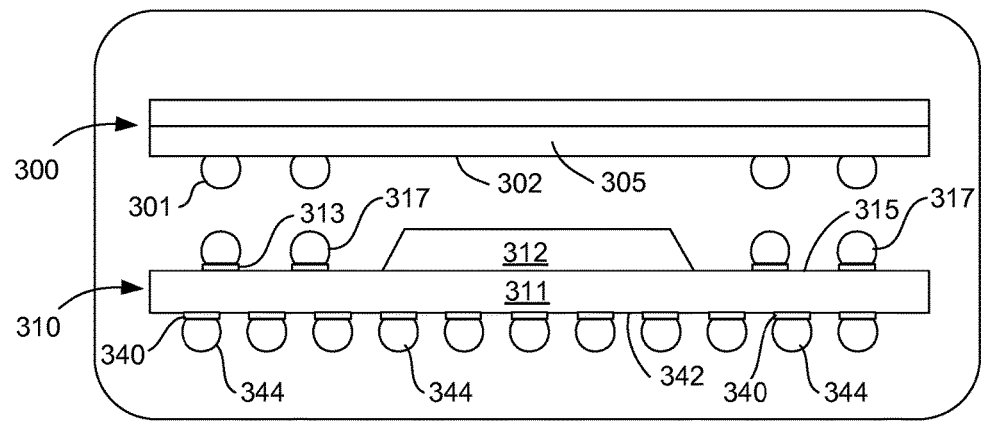
FIGS. 3(a) and 3(b) diagrammatically illustrate package on package stacking approach in accordance with one embodiment.

Referring now to FIG. 3, a stacked package arrangement and assembly method in accordance with the present invention will be described that is suitable for packaging integrated circuits. The illustrated arrangement is a form often referred to as a package on package (PoP) type semiconductor package.

The top package 300 is a grid array package that may take most any desired grid array form. By way of example, in the illustrated embodiment, top package 300 takes substantially the same form as the top package 100 illustrated in FIGS. 1 and 2 although this is not a requirement. In the illustrated embodiment, one or more dice (not shown) are mounted on and electrically connected to a substrate 305. The substrate 305 may take the form of a conventional BGA substrate or any other suitable form and has solder bumps 301 on its bottom surface 302. As will be appreciated by those familiar with the art, the substrate 305 typically has a number of I/O pads (not shown) on its lower surface and routing traces and vias that facilitate electrical connection of the encapsulated die (or dice) to the I/O pads. Solder bumps 301 are formed on I/O pads. In some specific applications, the top package 300 may be a commodity type memory package and therefore its specific design may vary widely.

The bottom package 310 is a grid array type package having a substrate 311 that supports a flip chip mounted die 312. The substrate 311 has contact pads 313 on its top surface 315 that are complementary to the solder bumps on top package 300. Each contact pad 313 has an associated solder bump 317 thereon such that the solder bumps 317 may be positioned to face the solder bumps 301 on top package 300. The substrate 311 also has a set of contact pads 340 on its lower surface 342. The lower contact pads 340 are each bumped with corresponding solder balls 344 and are arranged to facilitate electrically coupling the bottom package 310 to an external device. Thus, the bottom package 310 is quite similar to the bottom package 110 illustrated in FIG. 1, except that solder bumps 317 are formed on the contact pads 313 on the top surface of substrate 311. Therefore, the bottom package also has an appearance that it somewhat similar to bottom package 210 illustrated in FIG. 2 with a significant exception that no encapsulant/molding material is deposited on the top surface of the substrate 111 and thus, there is no encapsulant that surrounds the solder bumps 317.

Like substrate 305, substrate 311 may take the form of a BGA substrate and typically includes routing traces and vias (not shown) that electrically connect the flip chip mounted die 312 to the upper and lower contact pads. The substrate may be formed from any suitable material—by way of example, BT (Bismaleimide-Triazine) FR4 and other such materials are commonly used to form the substrate.

Figure 3B:
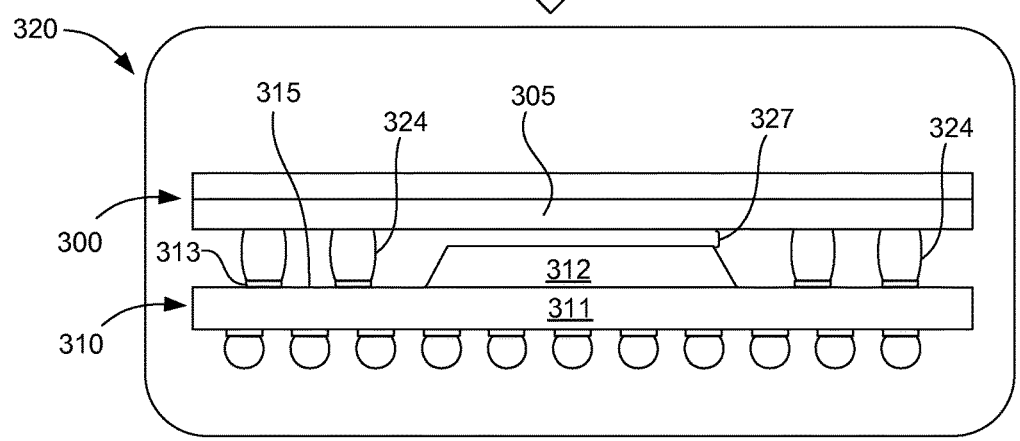

During assembly of a stacked package on package (PoP) device 320, the top package 300 is placed on the bottom package 310 and the facing solder bumps 301 and 317 on the top and bottom packages respectively are reflowed to form solder joints 324 between the I/O pads on the top package substrate 305 and the contact pads 313 on the bottom package substrate as illustrated in FIG. 3(b).

Figure 1A:
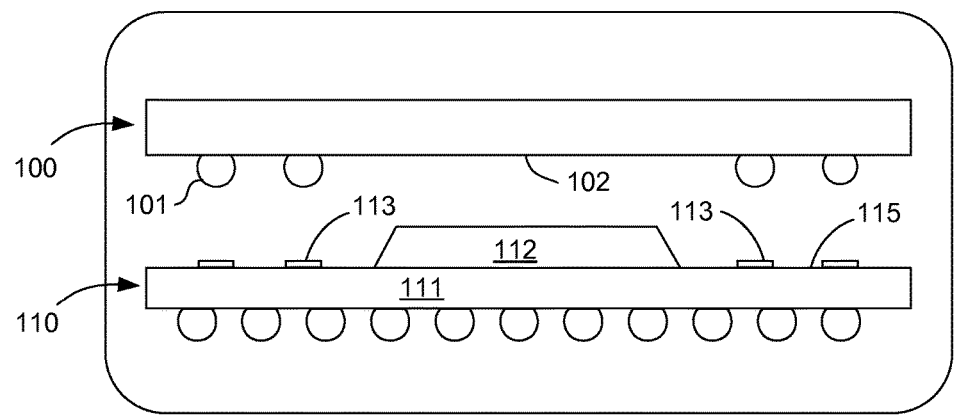
FIGS. 1(a) and 1(b) diagrammatically illustrate a previous package on package stacking approach.
Figure 1B:
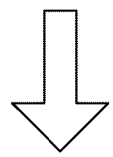
Figure 1B:
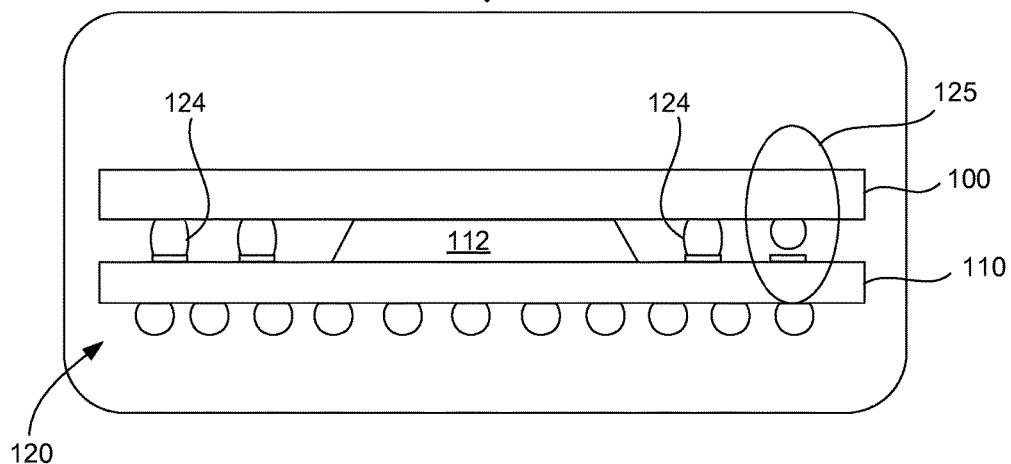
Figure 2A:
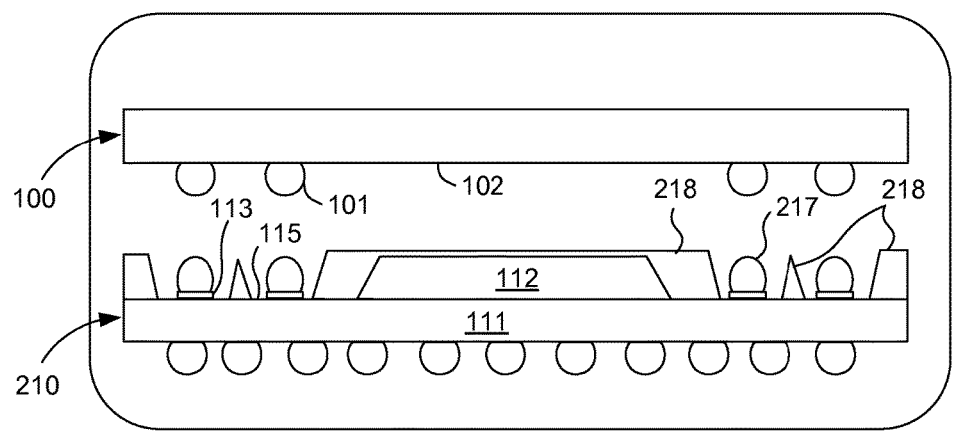
FIGS. 2(a) and 2(b) diagrammatically illustrate another previous package on package stacking approach.
Figure 2B:
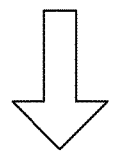
Figure 2B:
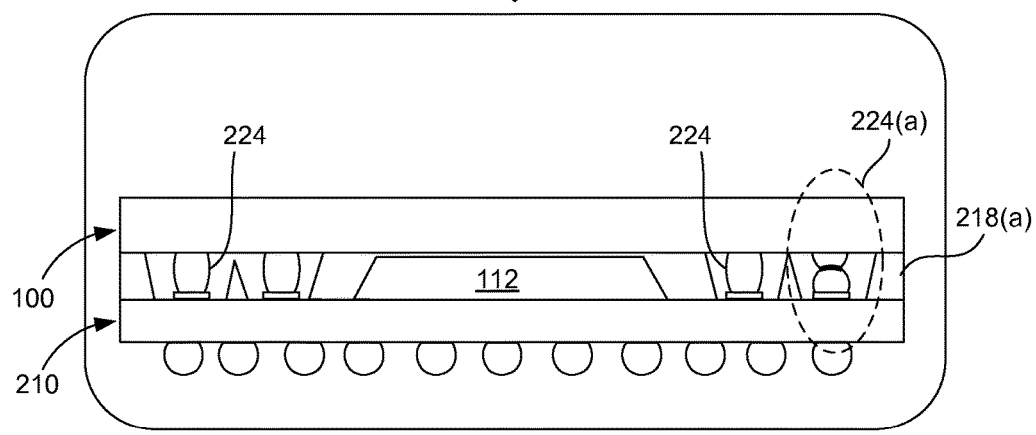

The volume of solder in the facing solder bumps 301, 317 and the solder reflow conditions are arranged so that the resulting solder joints 324 have a standoff height that is greater than the height of the flip chip mounted die 312. With this arrangement, an air gap 327 will be formed between the die 312 and the bottom surface 302 of top package 300 (which is typically the bottom surface of substrate 305). By designing in a gap between the die 312 and bottom surface 302, space is provided to accommodate warping of one or both of the packages 300, 310. That is, even if one (or both) of the packages are warped somewhat, there is a much higher probability that each of the facing solder ball pairs 301, 317 will come into contact with one another to thereby form robust solder joints 324. Thus, the air gap 327 provides sufficient tolerances so that the die 312 on the lower package 310 doesn't contact the bottom surface 302 of the top package 300 in a manner that prevents any of the facing solder ball pairs from reflowing together. It has been determined that this approach provides a significantly lower open contact defect rate than the conventional approach described above with respect to FIG. 1. The only extra step required in the formation of the bottom package 310 when compared to the approach of FIG. 1 is the bumping of the contact pads 313 on the top surface of the lower package—which is a relatively inexpensive process.

The described approach is more cost effective than the approach described above with respect to FIG. 2 because the steps of encapsulating the top surface of the lower package substrate 311 and then laser ablating the regions around the solder balls can be eliminated. The described approach also substantially eliminates the risk that ablation dust contaminates a potential solder joint in a manner that causes an open or defective contact.

The appropriate air gap between the top of die 312 and the adjacent bottom surface 302 of top package 300 will vary based on a number of factors including (a) the amount of warpage that might be expected in the component packages 300, 310; (b) package height constraints; (c) the positions of the solder bumps 301, 317; (d) the footprint size of the stacked packages; etc. It is noted that the term air gap distance is used because the actual standoff distance will vary somewhat based on the warpage of the specific components used, which will typically vary from component to component. The air gap would be expected if the actual components used had a reference warpage (which may be zero).

In one particular application, the top package 300 takes the form of a memory package (e.g. RAM, FLASH memory, etc.) and the bottom package 310 takes the form of a processor arranged to utilize the memory in the memory package. As will be appreciated by those familiar with the art, memory tends to be a commodity and therefore the quality and susceptibility to warpage may vary significantly by supplier and/or product line. The described PoP packaging approach can help facilitate the successful use of memory products from a variety of different suppliers and/or having significantly different cost points and warpage susceptibilities without requiring PoP package redesign and without incurring an undue number defects.

Figure 4A:
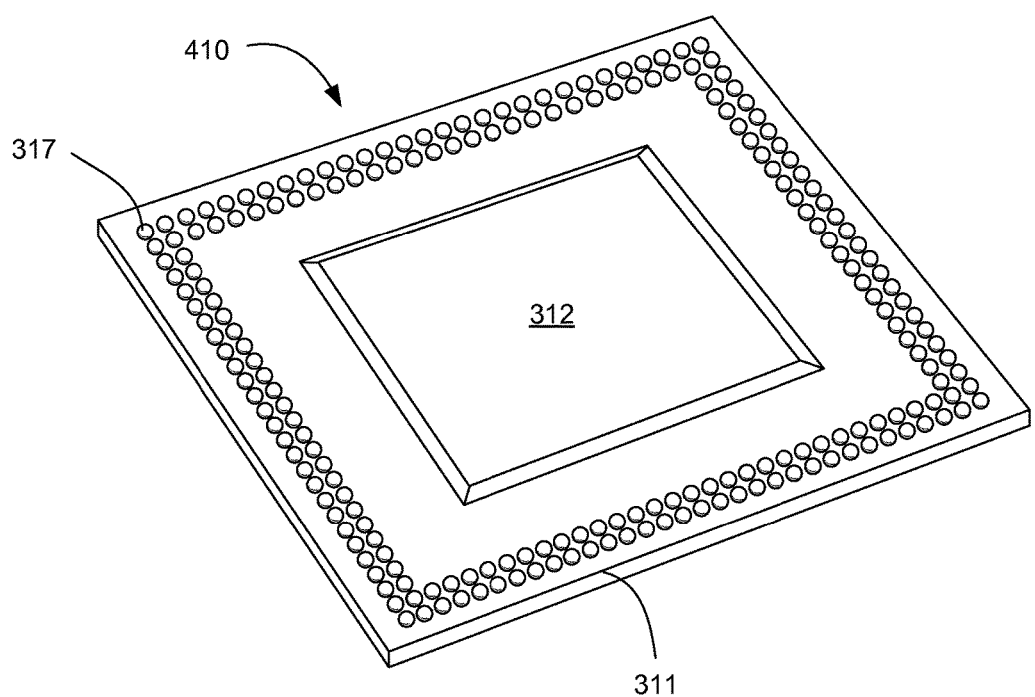
FIGS. 4(a) and 4(b) are diagrammatic perspective views of the top and bottom surfaces of a representative bottom package suitable for use in the embodiment of FIG. 3.
Figure 4B:
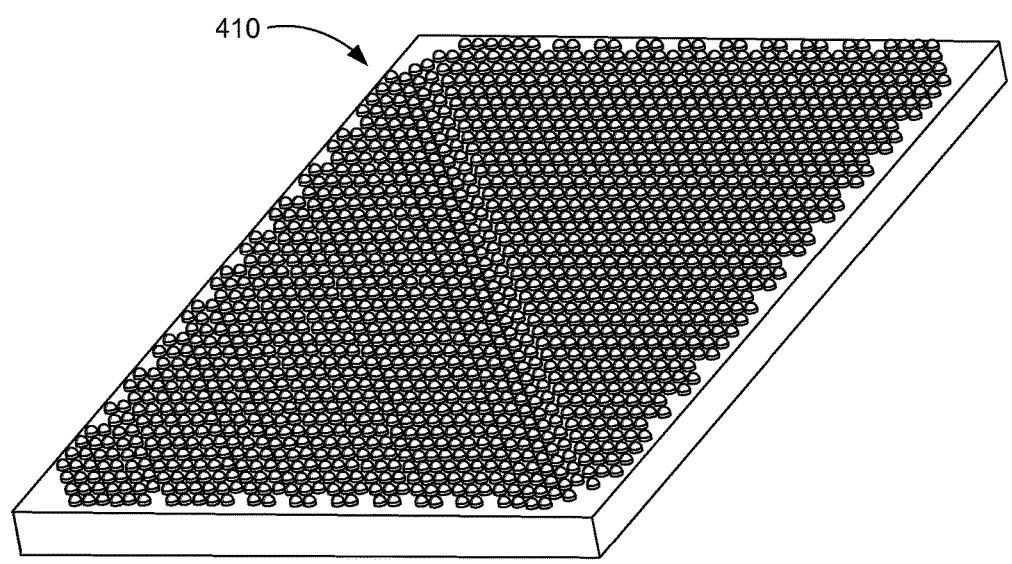

FIGS. 4(a) and 4(b) illustrate a processor package 410 suitable for use as the bottom package 310 in the embodiment of FIG. 3. As seen in FIG. 4(a), two rows of contact pads 313/solder balls 317 are provided around and peripherally outside of the die 312. The actual number of rows of contact pads/solder balls will vary in accordance with the design requirements of the processor—although 1-3 rows of contacts are most common In the illustrated embodiment the rows of contacts are continuous and symmetrical, but again, that is not a requirement. FIG. 4(b) illustrates the bottom surface of processor package 410.

Although only a few embodiments of the invention have been described in detail, it should be appreciated that the invention may be implemented in many other forms without departing from the spirit or scope of the invention. For example, although a particular top package design has been illustrated, it should be appreciated that the form factor of the top package may be widely varied. In the illustrated embodiment a two device PoP design is shown. However, it should be appreciated that the same approach can readily be used in PoP designs that stack 3 or more devices on top of one another. Therefore, the present embodiments should be considered illustrative and not restrictive and the invention is not to be limited to the details given herein, but may be modified within the scope and equivalents of the appended claims.

What is claimed is:

1. A method of packaging integrated circuits comprising:
   providing a first grid array package having a first substrate, a first die mounted on the first substrate and a multiplicity of first solder bumps on a lower surface of the first substrate, the multiplicity of first solder bumps being exposed at the lower surface of the first grid array package;
   providing a second grid array package having a second substrate, a second die flip chip mounted on a top surface of the second substrate, and a multiplicity of third solder bumps on the top surface of the second substrate, wherein the multiplicity of second solder bumps are exposed at a lower surface of the second grid array package, wherein the multiplicity of third solder bumps have a spacing that matches a spacing of the first solder bumps, and wherein no molding material is provided on the top surface of the second substrate;
   fusing the first solder bumps to corresponding ones of the third solder bumps to thereby form solder joints that electrically couple the first grid array package to the second grid array package and to thereby form a stacked package on package, wherein the respective sizes of the first and third solder balls are arranged such that a height of the resulting solder joints is greater than the height of the second die such that the first substrate does not contact any portion of the second package and an air gap is formed that separates the second die from the first package.

2. A method as recited in claim 1 wherein the first grid array package is a memory package and the second die is a processor.

3. A method as recited in claim 1 wherein after the soldering, no portion of the first grid array package physically contacts any portion of the second grid array package other than the solder joints.

4. A semiconductor packaging arrangement comprising:
   a first grid array package having a first substrate, a first die mounted on the first substrate and a multiplicity of first solder pads on a lower surface of the first substrate;
   a second grid array package having a second substrate, a second die flip chip mounted on a top surface of the second substrate, a multiplicity of second solder bumps on a lower surface of the second substrate, and a multiplicity of second solder pads on the top surface of the second substrate, wherein the multiplicity of second solder bumps are exposed at a lower surface of the second grid array package, and wherein the multiplicity of second solder pads have a spacing that matches a spacing of the first solder pads; and
   a multiplicity of solder joints that electrically couple the first grid array package to the second grid array package, wherein a height of the solder joints is greater than a height of the second die such that the first substrate does not contact any portion of the second package and an air gap separates the second die from the first package; and
   wherein no molding material is provided on the top surface of the second substrate; and
   wherein no portion of the first grid array package physically contacts any portion of the second grid array package other than the solder joints; and
   wherein the solder joints are formed by fusing first solder bumps attached to the first solder pads to third solder bumps attached to the second solder pads.

5. A semiconductor packaging arrangement as recited in claim 4 wherein the first grid array package is a memory package and the second die is a processor.

* * * * *